United States Patent [19]

Breneman et al.

[11] Patent Number: 5,418,462
[45] Date of Patent: May 23, 1995

[54] METHOD FOR DETERMINING SHIM PLACEMENT ON TUBULAR MAGNET

[75] Inventors: Bruce C. Breneman, San Diego; Yen-Hwa Hsu; Jang-Yu Hsu, both of Solana Beach, all of Calif.

[73] Assignee: Applied Superconetics, Inc., San Diego, Calif.

[21] Appl. No.: 237,256

[22] Filed: May 2, 1994

[51] Int. Cl.⁶ .............................................. G01V 3/00
[52] U.S. Cl. ..................................... 324/320; 324/319
[58] Field of Search ............... 324/320, 319, 318, 322; 335/301, 296, 299

[56] References Cited

U.S. PATENT DOCUMENTS

| | | |
|---|---|---|
| 4,498,048 | 2/1985 | Lee et al. |
| 4,656,449 | 4/1987 | Mallard et al. |
| 4,672,346 | 6/1987 | Miyamoto et al. |
| 5,045,794 | 9/1991 | Dorri et al. .......................... 324/320 |
| 5,343,151 | 8/1994 | Cory et al. .......................... 324/319 |
| 5,343,183 | 8/1994 | Shimada et al. ..................... 324/319 |

*Primary Examiner*—Louis Arana
*Attorney, Agent, or Firm*—Nydegger & Associates

[57] ABSTRACT

A method for using ferromagnetic shims to reduce the inhomogeneity of the magnetic field in a Diameter Spherical Volume (DSV) in the bore of a Magnetic Resonance Imaging (MRI) device is provided. More specifically, a magnetic field is established within the bore of the MRI device. An operator defines the DSV. The strength of the magnetic field is measured at the surface of the DSV. A Legendre polynomial is derived to model the inhomogeneity in the magnetic field in the DSV. A set of coefficients for the harmonic terms of the polynomial is calculated from the field strength measurements and segregated into three separate groups for evaluation. Each group of terms expresses field inhomogeneity in a unique set of spatial dimensions. Ferromagnetic shims are attached to the surface of the bore in individual dipole, linear bar, and ring arrangements to separately reduce the first, second, and third groups of harmonic coefficients to acceptable levels corresponding to a predetermined peak-to-peak inhomogeneity range.

15 Claims, 5 Drawing Sheets

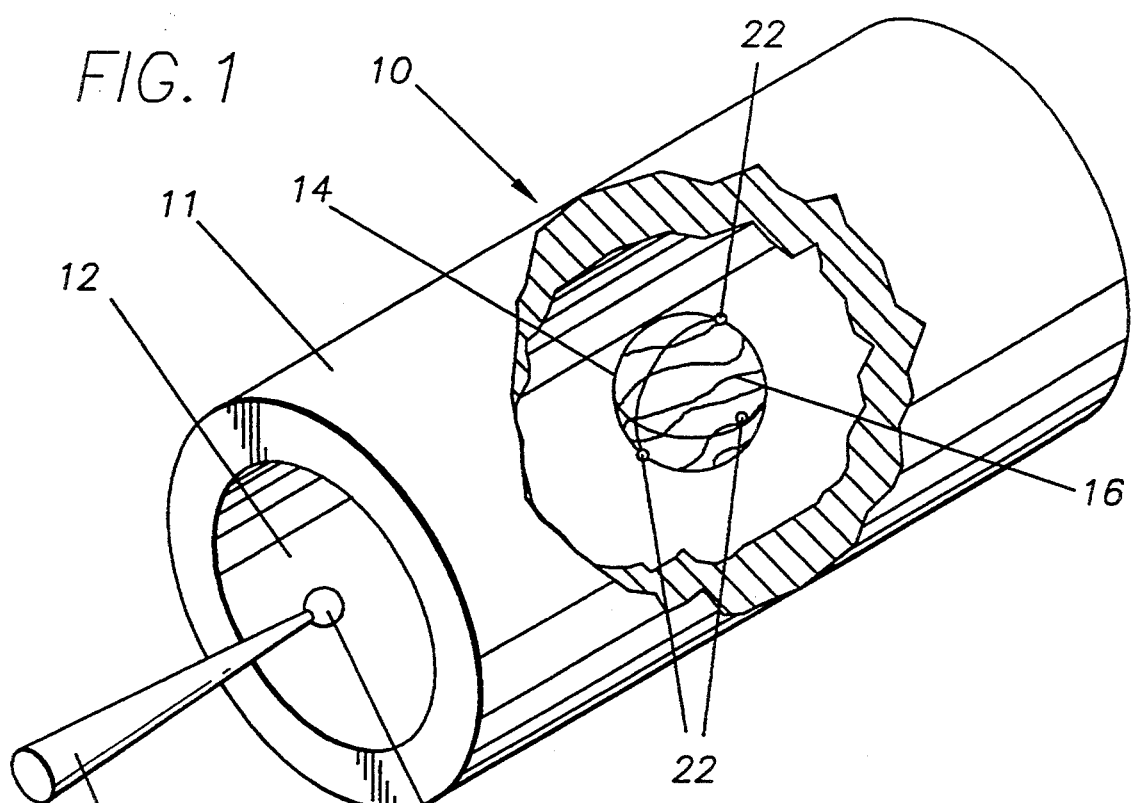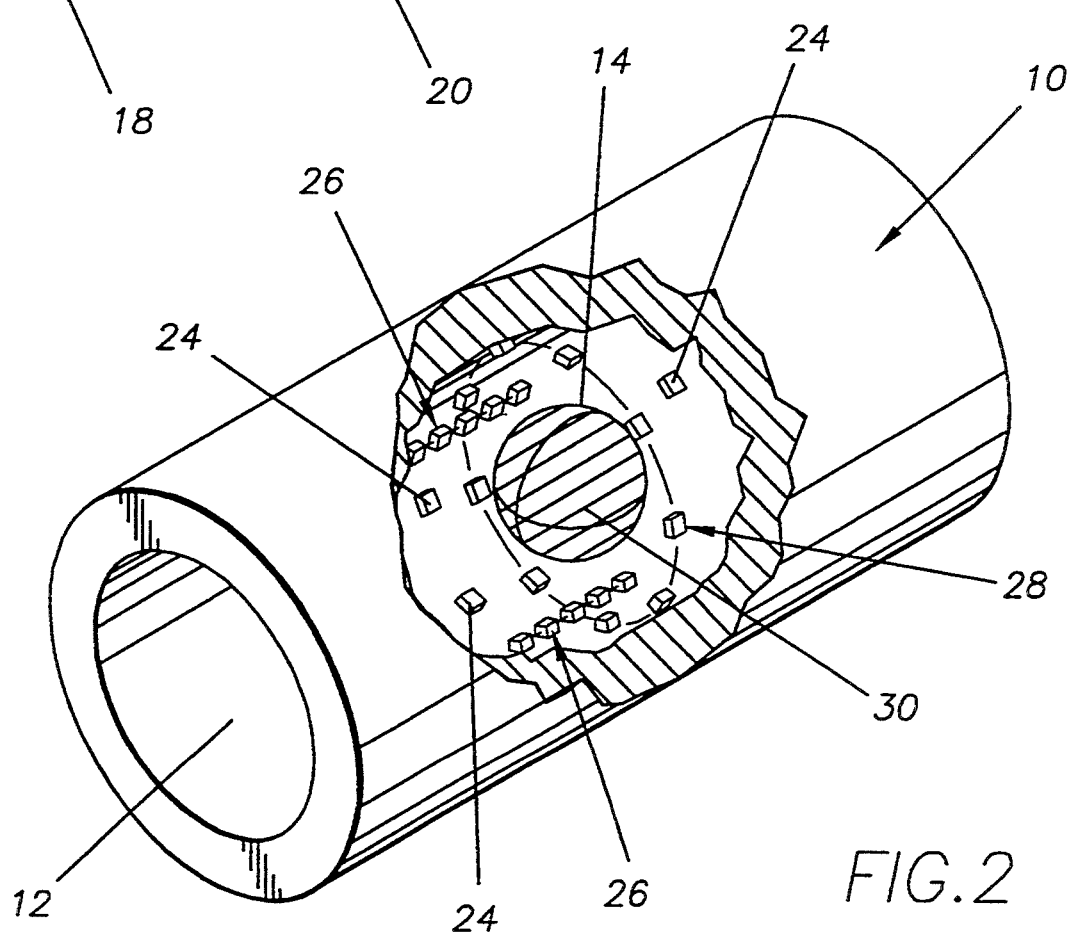

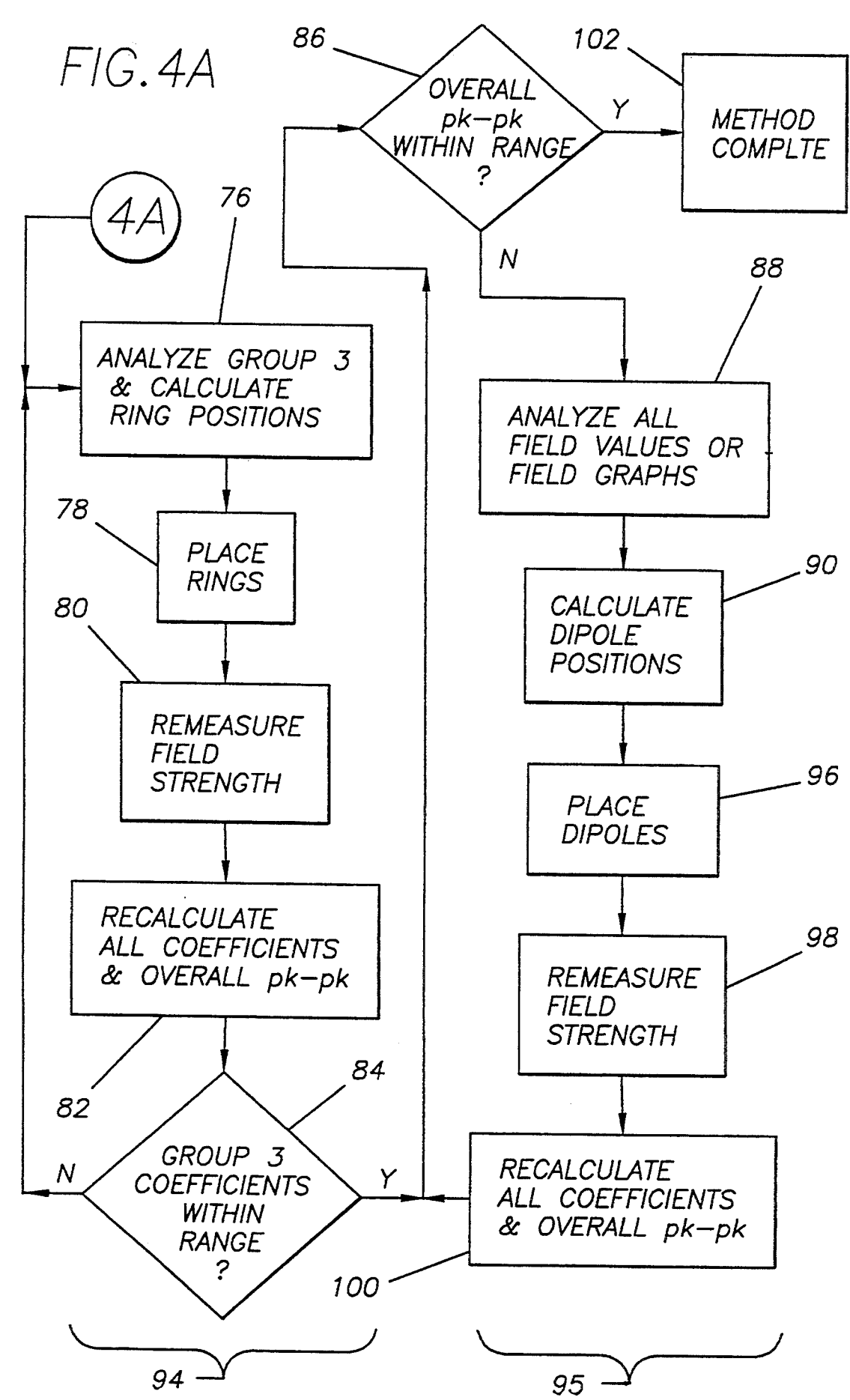

METHOD FOR DETERMINING SHIM PLACEMENT ON TUBULAR MAGNET

FIELD OF THE INVENTION

This invention relates generally to nuclear magnetic resonance imaging (MRI) systems requiring a homogeneous magnetic field for imaging in an MRI system. More specifically, the invention relates to a method for passive shimming in the bore of a cylindrical MRI system to minimize inhomogeneity of the magnetic field within a specific spherical volume inside the bore. The present invention is particularly, though not exclusively, useful for reducing inhomogeneity in the magnetic fields of MRI systems caused by the uniqueness of each individual MRI system and caused by terrestrial magnetic anomalies resulting from physical location of the MRI system.

BACKGROUND OF THE INVENTION

Magnetic resonance imaging (MRI) devices require a highly intense, homogeneous magnetic field of sufficient size to allow a portion of a patient to be placed in the homogeneous field and effectively visualized by MRI. MRI devices are valuable for medical diagnostic purposes, and are very instrumental in the early detection of cancerous tissues, tumors, and the like.

Generally, MRI systems operate by using a main coil of electrical windings to produce a magnetic field. A selected spherical region within the field is defined as the Diameter Spherical Volume (DSV). This is the selected design volume within which effective MRI images can be obtained. For MRI procedures, it is very important that the magnetic field in the DSV be sufficiently intense and homogeneous to provide proper image quality.

In most MRI systems, a hollow cylindrical main magnet is used, and the DSV is defined at a selected location, with a selected diameter, in the bore of the magnet. The patient can then be placed in the bore of the MRI system to position the particular portion of the patient's body to be imaged within the DSV. With the main coil activated, the magnetic field in the DSV is substantially homogeneous; in other words, there is a substantially uniform flux density throughout the DSV. This causes certain types of atoms in the patient, within the DSV, to effectively align their spin axes with each other. The patient is then momentarily subjected to radio frequency electromagnetic radiation from an RF source within the MRI device. The effect is to briefly tilt the atoms of the patient out of their original orientation and then allow them to return to that orientation, accompanied by the emission of RF waves which can be detected by an RF receiver. Measuring the intensity of the received signals as a function of the resonance frequency or magnetic field gives the operator information on the atoms of interest.

Additional electromagnetic coils, called gradient coils, are used to momentarily impose selected directional gradients on the main magnetic field within the DSV, to give the operator positional information on the atoms of interest. The gradient coils are selectively pulsed to impose these gradients while the patient is within the MRI device, to momentarily establish spatial identification within the DSV. Pulsing of the gradient coils coincides with the pulsing of the RF source. In other words, the gradient coils momentarily give each point within the DSV its own unique magnetic field value, establishing a unique resonance frequency for an atom at each point. Since the received RF signals are evaluated as a function of the resonance frequency, this enables the operator to identify the exact location of the source of each RF signal he receives as a result of reorienting of the spin axes of the atoms. Based on the position of the source and the intensity and frequency of each of the echo signals caused by the tilting and recovering of the atoms, the MRI system can produce an image of the portion of the patient positioned in the DSV.

Undesired inhomogeneities in the main magnetic field, however, will distort the position information established by the gradient coils and degrade the image quality. Where the radio frequency shifts of interest are in the range of a few parts per million or less, the inhomogeneity in the main magnetic field within the DSV must also be limited to a few parts per million. Unfortunately, even with the most meticulously designed and manufactured MRI devices, inhomogeneities in the main magnetic field will exist, and correction is necessary.

To improve field homogeneity, correction coils are frequently used. These correction coils, which are in addition to both the main coil and the gradient coils, are capable of creating different shaped magnetic fields which can be superimposed on an inhomogeneous main magnetic field. These superimposed fields shape the main magnetic field in a manner which increases the overall field homogeneity. Typically, many sets of correction coils are required. Often, as many as 10 to 20 independent sets of correction coils may be used, and each needs its own power supply to provide the correct current flow for proper operation.

Another way of providing the necessary field homogeneity is to shim the magnet passively, using pieces of iron or other ferromagnetic material, to bring an otherwise inhomogeneous field to within imaging homogeneity specifications. The iron can be applied in various forms, including small pieces called dipoles, longer pieces called bars, and rings. The bars and rings can be solid, or constructed of a plurality of dipoles. A device which uses iron dipole shims to reduce inhomogeneity in an MRI magnet is disclosed in U.S. Pat. No. 5,045,794 to Dorri et al. The Dorri patent describes a method of measuring the field inhomogeneity, measuring the effect of a defined shim placed at a plurality of defined locations, and calculating the sizes of shims to be placed at the defined locations to minimize the peak to peak inhomogeneity. This calculation is followed by placing shims as indicated by the calculation, and remeasuring the inhomogeneity. If the field is not within tolerance, the calculation is performed again, and more shims are added, or some are removed. The method disclosed by Dorri et al. involves creating a mathematical model expressing the amount of shim material used and the field inhomogeneity, and applying a single minimization procedure to this model, to attempt the simultaneous reduction of inhomogeneity throughout the DSV. Repetition of the entire procedure may be required. Thus, the method disclosed by Dorri et al. does not consider the possibility of reducing inhomogeneity in the DSV in an ordered sequence which avoids degradation of previously corrected inhomogeneities. The present invention, however, recognizes this possibility.

In light of the above, it is an object of the present invention to passively minimize inhomogeneity in the main magnetic field of an MRI magnet by properly positioning ferromagnetic shims in relation to the magnet. It is also an object of the present invention to provide a method for optimally minimizing the inhomogeneity in the DSV of a magnetic field in an ordered sequence of steps, wherein each step involves shim placement in a particular configuration designed to minimize particular contributions to the inhomogeneity. Still another object of the present invention is to provide a method for passively shimming a magnet which is easy to implement and comparatively cost effective.

SUMMARY OF THE INVENTION

The present invention pertains to a method for reducing the inhomogeneities of the magnetic field in the bore of an MRI magnet. This method is a three phase procedure.

In the first phase of the method, an operator defines a region in the bore as the DSV where the magnetic field is to be homogeneous. Once the desired DSV is determined, the operator sequentially positions a sensor at various selected locations on the surface of the DSV to obtain initial measurements of the magnetic field strength at these selected locations. Measurement points are selected in a plurality of planes, called zonal planes, which are perpendicular to the axis of the bore. Typically, either seven or twelve zonal planes are used.

In the second phase, using the field strength measurements obtained in the first phase, a high order Legendre polynomial is generated which represents the flux density of the magnetic field on the surface of the DSV, to a high order of accuracy. The general form of this polynomial is well known in the MRI art, and the particular form of the polynomial is generated by fitting the measured field data to the general form. The polynomial can be expressed in spherical coordinates, or in Cartesian coordinates, with the longitudinal axis of the main magnet being the Z axis. In spherical coordinates, the field is described as harmonics of the function $P_n^m(\theta)$ with the general equation, $$B_z(r,\theta,\phi) = B_o \sum_{n=0}^{\infty} \sum_{m=0}^{n} (r/r_o)^n P_n^m(\theta)[A_n^m \cos m\phi + B_n^m \sin m\phi]$$

Where $B_o$ is the central field intensity, $r_o$ is the radius of the measurement sphere, and r, $\theta$, and $\phi$ are the spherical coordinates.

Each term of the polynomial on the right side of this equation, called a harmonic term, has a numerical coefficient, called a harmonic coefficient. These coefficients are calculated as part of the process of deriving the particular polynomial from the field strength data. In addition, the overall peak-to-peak inhomogeneity of the field on the surface of the DSV is calculated. The overall peak-to-peak inhomogeneity represents a ratio of the difference between the maximum flux density and the minimum flux density at measured locations on the surface of the DSV, to the central flux density, and it is expressed in parts per million.

The terms of the Legendre polynomial are segregated into three groups. The first group of terms represent inhomogeneities which vary with all three of the coordinates which express the position of the point on the surface of the DSV. In other words, these terms express inhomogeneities in all three dimensions, X, Y, and Z in the Cartesian system. The second group of terms represent inhomogeneities which vary primarily with the radial and angular coordinates of the point, or X and Y in the Cartesian system, irrespective of the axial coordinate of the point. The third group of terms represent inhomogeneities which vary only with the axial coordinate of the point, or Z in the Cartesian system. These three groups of terms are respectively referred to as the Tesseral Dipole group, the Tesseral Bar group, and the Zonal group. Expressed algebraically, the Tesseral Dipole terms of the polynomial are those containing the expressions zx, zy, $z^2x$, $z^2y$, $z^3x$, $z^3y$, $z(x^2-y^2)$, zxy, $z^2(x^2-y^2)$, and $z^2xy$. The Tesseral Bar terms are those containing the expressions x, y, $x^2-y^2$, xy, $x^3$, and $y^3$. The Zonal terms are those containing only the expressions z, $z^2$, $z^3$, ... $z^{n-1}$, where n is the number of zonal planes in which measurements are taken.

In the third phase of the method, the optimum shim placement and shim size are calculated which will result in minimization of each of the harmonic coefficients of the terms of the Legendre polynomial. Each of the coefficients of the polynomial, and hence the contribution of each term to the peak-to-peak inhomogeneity, are reduced by calculating the effect of an ordered and selective placement of dipoles, bars, and rings in the bore of the main MRI magnet. The exact size and location for placement of the shims are determined by analyzing the absolute and relative magnitudes of the harmonic coefficients in a particular group of terms, and calculating the predicted effects of different theoretical shim arrays on the affected harmonic coefficients, using conventional computer techniques. Shim sizes and locations are recorded and maintained in an iron inventory, to enable successive iterations of the minimization to most efficiently add or remove iron as required. Each term of the polynomial is assigned a weighting factor which determines the relative emphasis to be placed on reduction of the coefficient of that term. The higher the weighting factor, the more emphasis is placed on reducing that term. Typically, the higher order terms should be given higher weighting factors, and weighting factors typically vary from 0 to 32. Other weighting factors can be used, but the end purpose is to establish the emphasis to be placed on the reduction of a given coefficient, relative to the other coefficients. Initially, for a given magnet design, the selection of weighting factors will necessarily be arbitrary.

The most desirable values for the coefficients would be zero; however, actual reduction of all of the coefficients to zero would normally take a prohibitive number of iterations, consuming an inordinate amount of time. Therefore, acceptable target values for each of the harmonic coefficients are selected, with the selected target values being estimated to yield an acceptable overall peak-to-peak inhomogeneity. When first selecting the acceptable target values for the coefficients, in shimming a given magnet design, the selected values are necessarily arbitrary. For cylindrical magnets having Diameter Spherical Volumes between 40 and 50 cm. in diameter, coefficients below 5 ppm have generally been found satisfactory. If reduction of the harmonic coefficients to the selected coefficient ranges fails to yield an acceptable homogeneity, the target coefficient ranges can be reduced to lower values and the process repeated. Eventually, for each design of main magnet, a set of weighting factors and target coefficient ranges will be learned that will result in the desired peak-to-peak inhomogeneity for that magnet design.

The Tesseral Dipole group is reduced first. A theoretical placement of dipoles is derived that appears to be desirable by analysis of the Tesseral Dipole group of harmonic coefficients in the mathematical model. This derivation can take several well known forms, essentially involving theoretical placement of an iron shim followed by calculation of the predicted effect of the placement of the shim in changing the coefficients of the group being analyzed. Numerous iterations of this process are repeated until the coefficients are reduced to their selected target values. This is followed by placing the dipoles in the bore, remeasuring the field strength, and calculating new actual values for all three groups of coefficients. Next, the Tesseral Bar group is reduced by a similar analysis method. The theoretical size and placement of linear bars of iron which are oriented parallel to the axis of the bore of the main magnet are calculated by analysis of the Tesseral Bar group of harmonic coefficients. Then, the bars are put in place, and the field is remeasured. This is followed by calculating new values for coefficients in all three groups. Finally, the Zonal group can be reduced by analyzing the coefficients in that group, and calculating the desired theoretical placement of iron rings, or circular arrangements of dipoles, which are oriented in planes perpendicular to the axis of the bore. The rings are put in place, the field is remeasured, and new coefficients are calculated for all three groups.

After performing these minimization steps, the magnetic field in the DSV is remeasured and the process is repeated, if necessary. This portion of the third phase is completed when each of the harmonic coefficients of the mathematical model has been reduced to an acceptable value by the step-wise reduction process. However, this process may not result in reduction of the overall peak-to-peak inhomogeneity to a level which is considered acceptable. For the present invention, an acceptable overall peak-to-peak inhomogeneity is between 5 and 25 ppm for Diameter Spherical Volumes having diameters between 40 and 50 cm. Furthermore, even if the peak-to-peak value is sufficiently low, the variations in flux density may contain so many sharp peaks and valleys that image quality will be poor.

If the desired homogeneity has not been achieved, the overall inhomogeneity can be further reduced by one of two methods. Under a first method, the maximum and minimum field values are simultaneously analyzed to arrive at a theoretical iron placement or removal scheme. The effect of this theoretical scheme on all three groups is then calculated, and the process is repeated if required to reach the acceptable range of overall peak-to-peak inhomogeneity. Under a second method, graphs of the measured magnetic field profiles can be viewed, and addition or removal of dipoles can be proposed to visually minimize the overall inhomogeneity. The results of these additions or removals can then be measured and graphed to determine whether the resulting inhomogeneity has been sufficiently reduced.

The novel features of this invention, as well as the invention itself, both as to its structure and its operation, will be best understood from the accompanying drawings, taken in conjunction with the accompanying description, in which similar reference characters refer to similar parts, and in which:

BRIEF DESCRIPTION OF THE DRAWINGS

FIG. 1 is a cut-away perspective view of the MRI device showing the inhomogeneous DSV during measurement of the initial field data;

FIG. 2 is a cut-away perspective view of the MRI device showing the homogeneous DSV after performance of the method of the present invention, with individual dipoles, bars, and rings placed within the bore;

FIGS. 4 and 4A show a detailed schematic of the steps of phase three of the method of the present invention.

DESCRIPTION OF PREFERRED EMBODIMENTS

Figure 3:
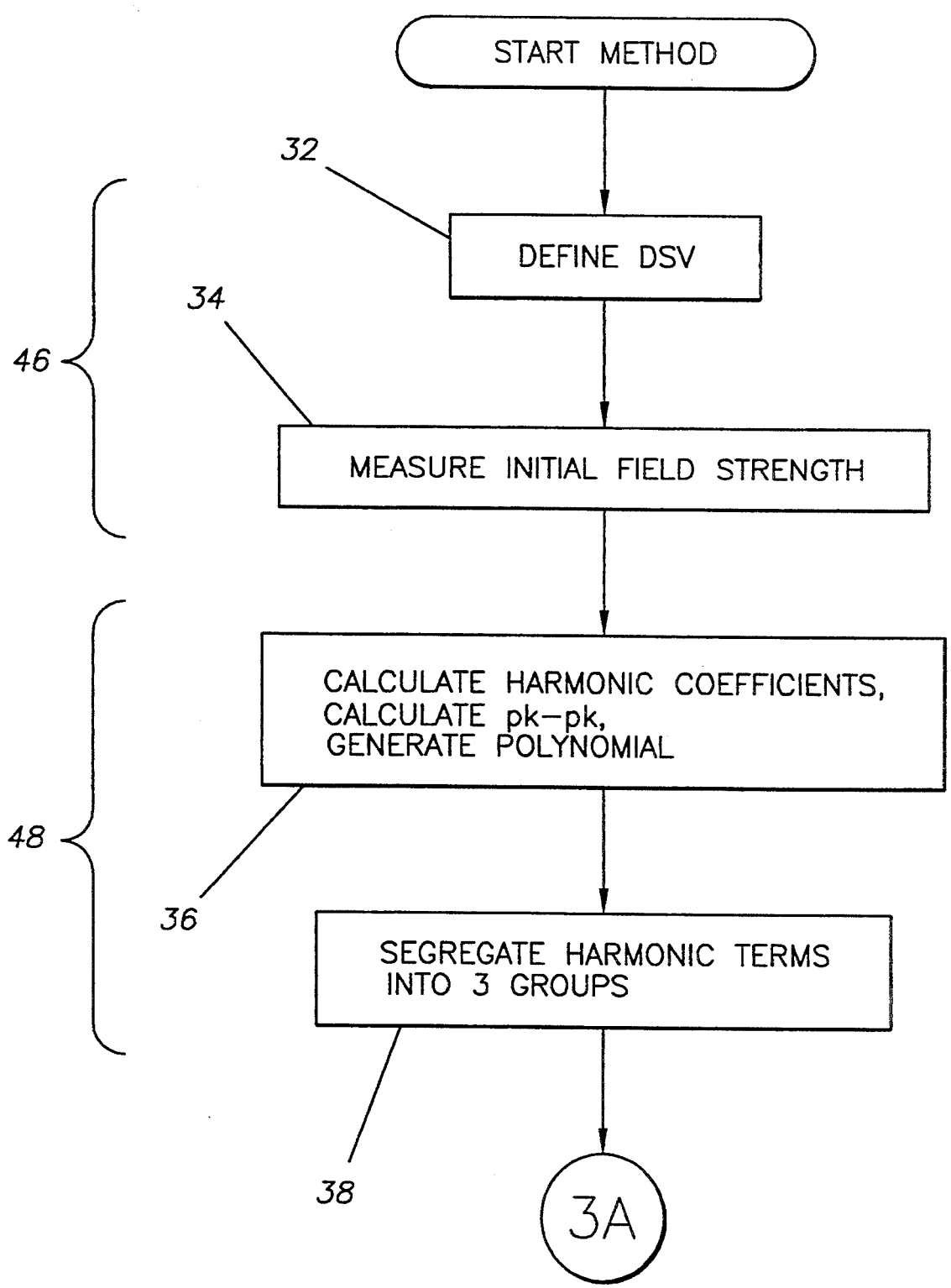
FIGS. 3 and 3A show a general schematic of the method of the present invention.

Referring initially to FIG. 1, a cylindrically shaped MRI device is shown and generally designated 10. The MRI device 10 has a main magnet 11, with a bore 12, typically called a warm bore, that is formed longitudinally along the central axis of the MRI device 10. In the bore 12, a Diameter Spherical Volume, hereinafter referred to as a DSV 14, is defined by the designer or operator. The DSV 14 must include an intense and homogeneous magnetic field for proper imaging.

During normal operation, the patient (not shown) is placed in the bore 12. The patient is positioned so that the part of the patient to be imaged is coincident with the DSV 14. The gradient coils and RF source (not shown) are then pulsed. Based on the resulting RF signals, the MRI system 10 produces an image.

As shown in FIG. 1, the main magnet 11 is un-shimmed and, therefore, the DSV 14 has an inhomogeneous magnetic field represented by wavy flux lines 16. The inhomogeneous magnetic field is measured by a magnetic field sensor 20, as the magnetic field sensor 20 is selectively positioned at various locations inside the bore 12 by the adjustable mapping apparatus 18.

Also shown in FIG. 1 are a plurality of measured points 22, which are on the surface of the DSV 14. The points shown are a small fraction of the total number of measured points. During the initial magnetic field measurement or during subsequent magnetic field measurements, the magnetic sensor 20 is positioned on the surface of the DSV 14 at the measurement points 22 to obtain magnetic field measurements which are used to produce the mathematical model of the inhomogeneity of the magnetic field on the surface of the DSV 14. In measuring the magnetic field strength, it is acceptable to take magnetic field measurements only at the surface of the DSV 14 because, as is well known in electromagnetics, the inhomogeneity of the magnetic field inside the DSV 14 is typically less than at the surface. Thus, if the inhomogeneity at the surface of the DSV 14 is within the desired levels, the inhomogeneity within the DSV 14 should also be within desired levels.

Turning now to FIG. 2, the MRI device 10 is shown at the completion of the method of the present invention. Spatial locations can be given in Cartesian or spherical coordinates. For reference purposes, the center of the DSV 14 in the bore 12 of the MRI system 10 may be defined as the center of a coordinate system, with the Z-axis collinear with the central axis of the bore 12. Consequently, for Cartesian coordinates, the X and Y axes define a plane which is perpendicular to the central axis of the bore 12.

In FIG. 2, the DSV 14 contains a homogeneous magnetic field represented by straight flux lines 30, essentially parallel to the central axis of the magnet 11, signifying the completion of the method. In order to achieve a homogeneous magnetic field within the DSV 14, a plurality of individual dipoles 24, a bar 26, and a ring 28 have been positioned on the surface of the bore 12. The dipoles, bar, and ring shown are only representative of the plurality of such iron elements that may typically be used in performing the method on any given MRI device.

Each dipole 24 is positioned on the surface of the bore 12 in order to reduce inhomogeneity in the magnetic field within the DSV 14. The dipole 24 can be positioned as needed anywhere along the surface, at any zonal and angular position. Because of the geometry of the dipole 24, alteration of the magnetic field will occur in all three dimensions. Therefore, the dipole 24 is used primarily to reduce the harmonic coefficients of the Tesseral Dipole group of terms of the mathematical model, but the other two groups of terms will also be affected to a certain degree.

Each bar 26 is longitudinally mounted on the surface of the bore 12, parallel to the axis of the bore 12. The bar 26 can be positioned as needed anywhere along the surface, at any angular position. Because of the geometry of the bar 26, reduction of the inhomogeneity of the magnetic field will occur primarily in the X and Y dimensions. Therefore, the bar 26 is used primarily to reduce the harmonic coefficients of the Tesseral Bar group of terms, but the Zonal group will also be affected to a certain degree. No appreciable effect will occur in the Tesseral Dipole group.

Finally, the ring 28 is positioned on the surface of bore 12, in a plane perpendicular to the axis of bore 12. The ring 28 can be positioned as needed anywhere along the surface, at any zonal position. Because of the geometry of the ring 28, reduction of the inhomogeneity of the magnetic field will occur primarily in the Z dimension. Therefore, the ring 28 is used primarily to reduce the harmonic coefficients of the Zonal group of terms, and no appreciable effect will occur in the other two groups.

Figure 3A:
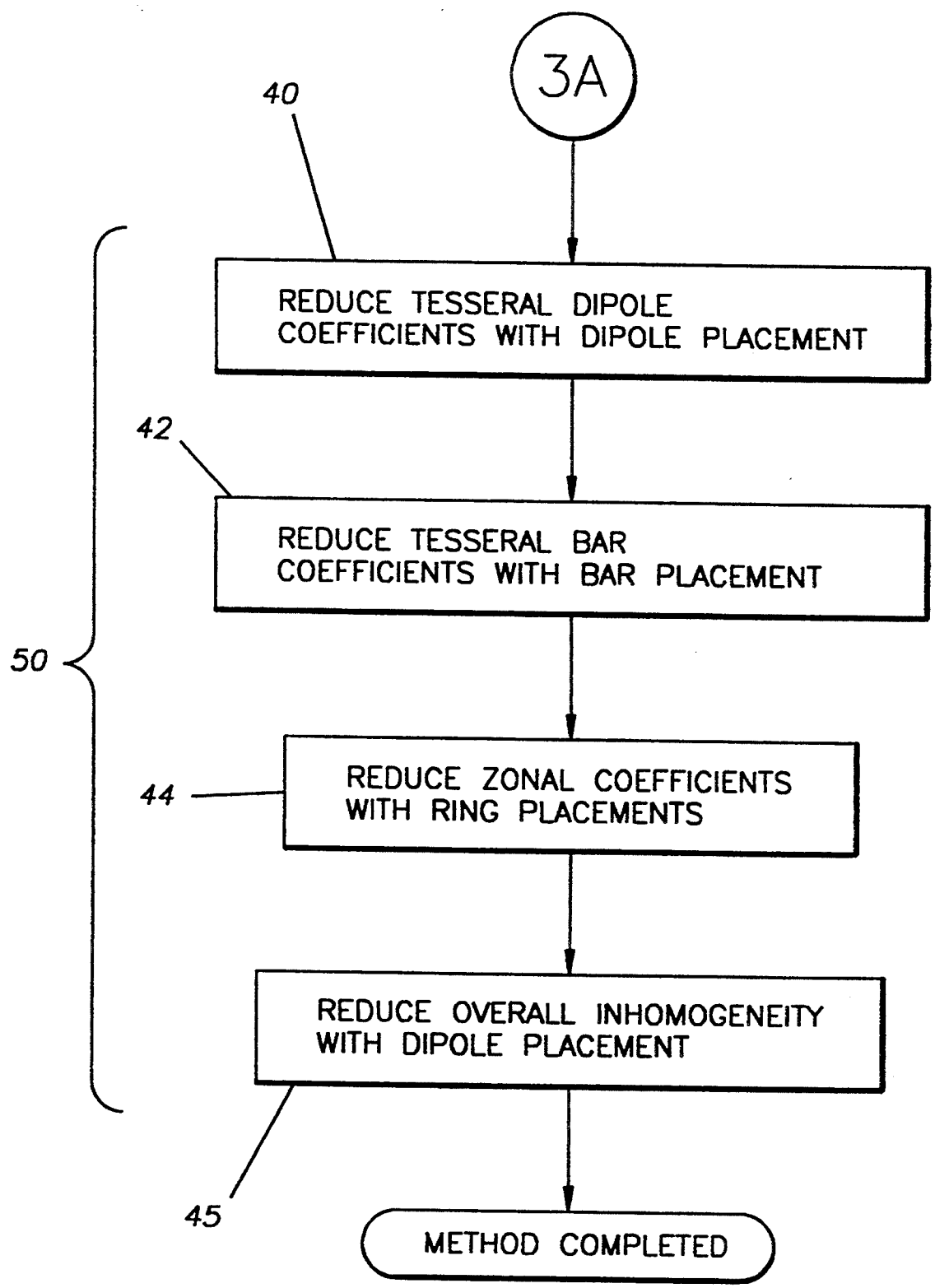

The method of passively shimming the MRI device 10 is generally depicted in FIGS. 3 and 3A, which show an overview flow chart of the method of the present invention. The method begins by defining the DSV 14, step 32. The initial magnetic field strength on the surface of the DSV is measured, step 34. This completes phase 1, item 46.

From the values obtained during the initial magnetic field measurement, step 34, the harmonic coefficients are calculated, a Legendre polynomial having the form $$B_o \sum_{n=0}^{\infty} \sum_{m=0}^{n} (r/r_o)^n P_n^m(\theta)[A_n^m \cos m\phi + B_n^m \sin m\phi]$$

is generated to represent the magnetic field inhomogeneity on the surface of the DSV, and the overall peak-to-peak inhomogeneity is calculated, step 36. The terms of the polynomial are then segregated into three groups, step 38. These groups are referred to as the Tesseral Dipole group, the Tesseral Bar group, and the Zonal Group. This completes phase 2, item 48.

Then, inhomogeneity in the magnetic field within the DSV 14, as expressed in the Tesseral Dipole group of harmonic terms, is reduced by selectively placing a plurality of dipoles 24 on the surface of the bore 12, step 40. Keeping in mind the field alteration resulting from the aforementioned placement of dipoles 24, the inhomogeneity of the magnetic field within the DSV 14 occurring primarily in the X and Y dimensions, as expressed in the Tesseral Bar group of harmonic terms, is reduced by selectively placing linear bars 26 or linear arrangements of dipoles on the surface of the bore 12, step 42. Finally, keeping in mind the field alteration resulting from the aforementioned placement of dipoles 24 or linear bars 26, the inhomogeneity of the magnetic field occurring within the DSV 14 primarily in the Z dimension, as expressed in the Zonal group of harmonic terms, is reduced by selectively placing rings 28 or circular arrangements of dipoles on the surface of the bore 12, step 44. Finally, the overall inhomogeneity of the magnetic field is reduced by analyzing all of the harmonic terms at once or by visually analyzing graphs of the field strength, and selectively placing dipoles on the surface of the bore 12, step 45. This completes phase 3, item 50.

Regarding the second phase of the method, bracket 48 of FIG. 3, the harmonic coefficients have been defined as numerical coefficients of harmonic algebraic terms of the Legendre polynomial, expressed in terms of the variables X,Y and Z. These terms have been segregated into three groups, namely, the Tesseral Dipole group, the Tesseral Bar group, and the Zonal group.

Specifically, the Tesseral Dipole group of harmonic terms, f(x,y,z), are those containing the expressions: zx, zy, $z^2x$, $z^2y$, $z^3x$, $z^3y$, $z(x^2-y^2)$, zxy, $z^2(x^2-y^2)$, and $z^2xy$. This can be referred to as Group One. The Tesseral Bar group of harmonic terms, f(x,y), are those containing the expressions: x, y, $x^2-y^2$, xy, $x^3$, and $y^3$. This can be referred to as Group Two. Finally, the Zonal group of harmonic terms, f(z), are those containing the expressions: $z^n$, where n ranges from 1 to one less than the number of zonal planes in which the field measurements are taken. This can be referred to as Group Three.

In the third phase of the method, bracket 50 in FIG. 3A, the harmonic coefficients are reduced. The means to calculate the reductions of the harmonic coefficients typically comprise computer means (not shown) using well-known algorithms for analyzing the contribution of terms in a given group to the inhomogeneity, theorizing a shim size and placement, and calculating the effect of the theoretical shim placement. Analysis of the graphs of the field can be accomplished manually to visually minimize the overall inhomogeneity.

The following chart lists the different groups of terms which were analyzed in the case of a plot of 12 zonal planes, in shimming a 1.5 Tesla magnet, for a 50 cm. DSV. Higher orders of terms could be analyzed if increased homogeneity were desired.

TABLE 1

| Group 1, Tesseral Dipole Group | | Group 2, Tesseral Bar Group | | Group 3, Zonal Group | |
|---|---|---|---|---|---|
| ZX | | X | | Z | |
| IC | 2.08 | IC | −14.02 | IC | 119.60 |
| FC | 0.05 | FC | 0.41 | FC | 2.98 |
| WF | 8.00 | WF | 4.00 | WF | 2.00 |
| ZY | | Y | | $Z^2$ | |
| IC | 1.76 | IC | −36.31 | IC | −46.19 |
| FC | −0.14 | FC | −0.06 | FC | −1.07 |
| WF | 8.00 | WF | 4.00 | WF | 3.00 |
| $Z^2X$ | | $X^2-Y^2$ | | $Z^3$ | |
| IC | −4.13 | IC | 29.00 | IC | −11.86 |
| FC | 0.65 | FC | −0.12 | FC | 2.64 |
| WF | 16.00 | WF | 12.00 | WF | 4.00 |
| $Z^2Y$ | | XY | | $Z^4$ | |
| IC | −12.12 | IC | 8.58 | IC | −52.66 |
| FC | −1.19 | FC | −0.03 | FC | 2.32 |
| WF | 16.00 | WF | 12.00 | WF | 4.00 |
| $Z^3X$ | | $X^3$ | | $Z^5$ | |

TABLE 1-continued

| Group 1, Tesseral Dipole Group | | Group 2, Tesseral Bar Group | | Group 3, Zonal Group | |
|---|---|---|---|---|---|
| IC | −2.98 | IC | −7.68 | IC | 26.04 |
| FC | 0.03 | FC | 0.06 | FC | 1.16 |
| WF | 32.00 | WF | 32.00 | WF | 8.00 |
| $Z^3Y$ | | $Y^3$ | | $Z^6$ | |
| IC | 5.16 | IC | −18.84 | IC | 71.82 |
| FC | −0.15 | FC | 0.04 | FC | 4.25 |
| WF | 32.00 | WF | 32.00 | WF | 12.00 |
| $Z(X^2-Y^2)$ | | | | $Z^7$ | |
| IC | −15.67 | | | IC | −10.55 |
| FC | 0.14 | | | FC | −0.72 |
| WF | 16.00 | | | WF | 16.00 |
| $ZXY$ | | | | $Z^8$ | |
| IC | 7.87 | | | IC | −18.45 |
| FC | 0.25 | | | FC | 5.46 |
| WF | 16.00 | | | WF | 20.00 |
| $Z^2(X^2-Y^2)$ | | | | $Z^9$ | |
| IC | −4.64 | | | IC | 1.42 |
| FC | −0.14 | | | FC | −1.58 |
| WF | 32.00 | | | WF | 20.00 |
| $Z^2XY$ | | | | $Z^{10}$ | |
| IC | 4.79 | | | IC | −2.68 |
| FC | 0.34 | | | FC | 3.26 |
| WF | 32.00 | | | WF | 32.00 |
| | | | | $Z^{11}$ | |
| | | | | IC | −5.23 |
| | | | | FC | −0.54 |
| | | | | WF | 32.00 |

As presented in Table 1, the harmonic terms are divided into three columns. The left column shows the Tesseral Dipole harmonic terms, the middle column shows the Tesseral Bar harmonic terms, and the right column shows the Zonal harmonic terms. Next to each term are listed an Initial Coefficient (IC) calculated before any optimization steps, a Final Coefficient (FC) calculated after optimization of all groups, and a Weighting Factor (WF) assigned to that term during the optimization of the group in which the term resides. Each term of the other two groups not being optimized might also be assigned an alternate Weighting Factor which is relatively small, or even zero, during optimization of the selected group. No such alternate Weighting Factors are shown in this table. The overall peak-to-peak inhomogeneity was reduced from 206.33 ppm to 13.94 ppm during this optimization.

In one embodiment of the present invention, the harmonic coefficients are reduced in the order of left column to right column. Once the Tesseral Dipole group of harmonic coefficients has been reduced, the subsequent reduction of the Tesseral Bar and Zonal groups of harmonic coefficients will have only a minimal effect on the values of the Tesseral Dipole harmonic coefficients previously achieved. Stated differently, the reductions of the Tesseral Bar and Zonal groups of harmonic coefficients will not degrade the reductions made to the Tesseral Dipole group of harmonic coefficients. Additionally, once the Tesseral Bar group of harmonic coefficients has been reduced, the reduction of the Zonal group of harmonic coefficients will have only a minimal effect on the values of the already reduced Tesseral Dipole and Tesseral Bar groups of harmonic coefficients. This effect stems directly from the segregation of the harmonic terms.

Figure 4:
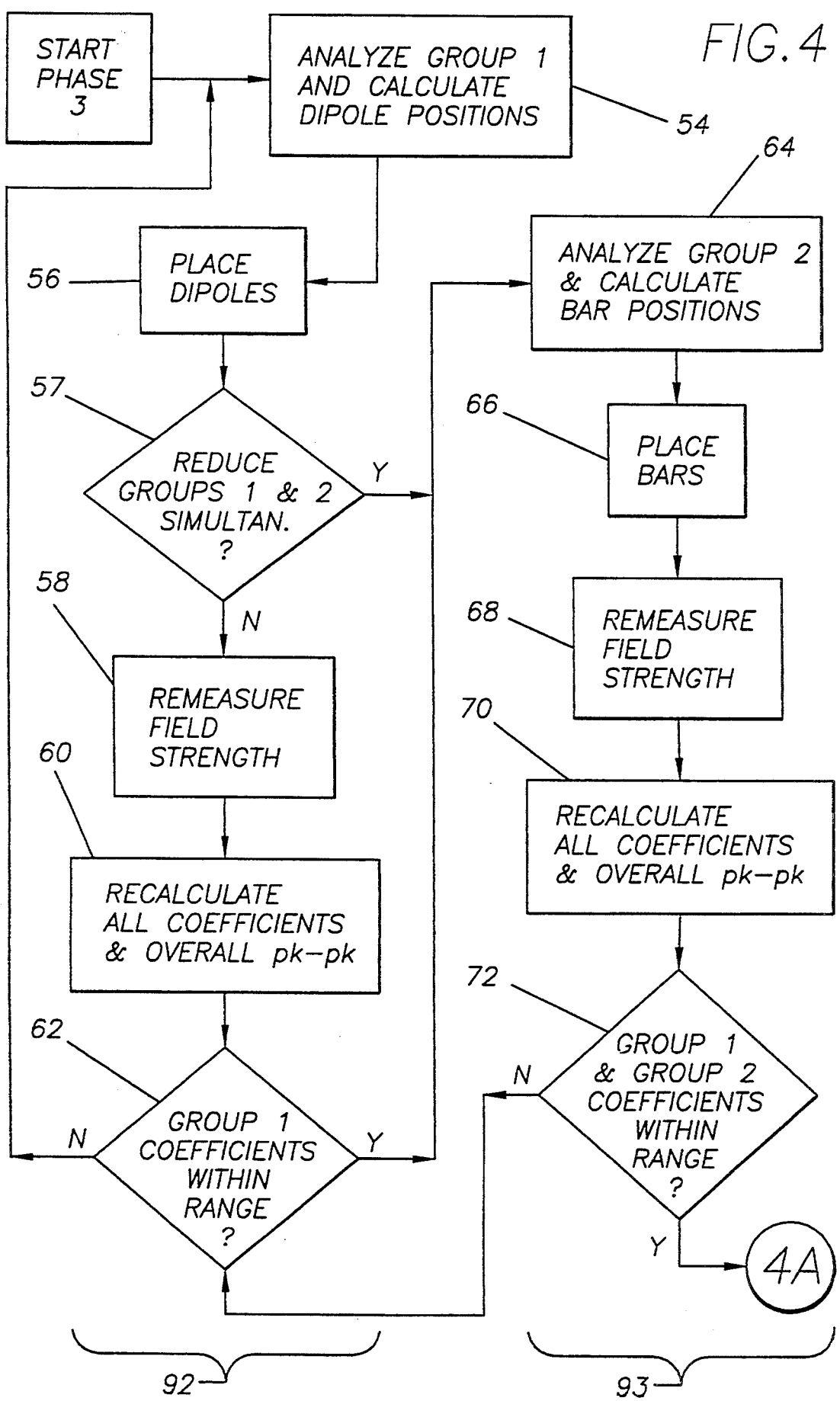

Specific steps of the method for reducing the inhomogeneity of the magnetic field within the DSV 14 are shown in FIGS. 4 and 4A, where the third phase of the method of the present invention is illustrated. The third phase involves the stepwise reduction of the three groups of harmonic coefficients. It is optional to reduce the coefficients of Groups 1 and 2 either separately or simultaneously. Generally, the steps of reducing the Tesseral Dipole group are denoted by bracket 92. The steps representing the reduction of the Tesseral Bar group are denoted by bracket 93. The steps for reducing the Zonal group of harmonic coefficients are denoted by bracket 94. Finally, the steps for overall reduction of the peak-to-peak inhomogeneity are denoted by bracket 95.

In the reducing the Tesseral Dipole group of harmonic coefficients, calculations, as described above, are performed which result in suggested positions and sizes for the dipoles 24, step 54. As previously stated, the techniques underlying these calculations are well known in the art. The dipoles 24, when placed in those suggested positions, are intended to reduce inhomogeneity. Using those results, the dipoles 24 are then positioned on the surface of the bore 12 at the suggested positions, step 56. A decision is made whether to reduce Groups 1 and 2 simultaneously, step 57. If the decision is No, the method proceeds to step 58, if Yes, to step 64. In step 58, the resulting field strength, as altered by positioning the dipoles 24, is measured. From the new field strength measurements, a new set of harmonic coefficients are calculated for all three groups, step 60. At step 62, the new values for the Tesseral Dipole group of harmonic coefficients are compared to the selected limits which will result in the desired peak-to-peak inhomogeneity range. Should the values of the Tesseral Dipole group of harmonic coefficients fall within that range, the operation of the method will continue at step 64. However, should the new values for the Tesseral Dipole group of harmonic coefficients fail to fall within the predetermined range, steps 54 through 62 are repeated. Effectively, steps 54 through 62 represent the method to separately reduce the Tesseral Dipole group of harmonic coefficients.

Turning now to step 64, the Group 2 terms are analyzed, and the positions and sizes of bars 26 are calculated. The algorithm underlying this calculation is designed such that the dipole bars 26 that will be added to the bore 12 will have the effect of reducing magnetic field inhomogeneity primarily in the X and Y directions. Such a result will be reflected in reduced values for the Tesseral Bar group of harmonic coefficients. The suggested arrangements of bars 26 are attached to the bore 12, step 66. Then, the magnetic field strength is remeasured, step 68, and new harmonic coefficients for all three groups, as altered by the attachment of the bars 26, are calculated, step 70. Next, the values of the coefficients in the Tesseral Bar and Tesseral Dipole groups are evaluated, step 72. If they are satisfactory, the method proceeds to step 76, if they are not, the method returns to step 62. It should be noted that, if Groups 1 and 2 are being simultaneously reduced, the evaluation of Group 1 coefficients upon returning to step 62 may return the method to step 54, or it may be returned to step 64, depending upon the acceptability of the Group 1 coefficients. If, on the other hand, Group 1 was first reduced individually, and Group 2 is being reduced thereafter, the coefficients of Group 1 should still be within specification, so the evaluation of Group 1 coefficients upon returning to step 62 should return the method to step 64.

Assuming that the decision at step 72 is Yes, the Group 3 terms are then analyzed, and the positions and sizes of the necessary rings 28 are calculated, step 76.

The algorithm underlying this calculation is designed such that the rings 28 that will be added to the bore will have the effect of reducing magnetic field inhomogeneity mainly in the Z direction, and will have minimal effects on the previously reduced inhomogeneity in the X or Y direction. The reduction of the inhomogeneities in the Z direction will be reflected in reduced values for the Zonal group of harmonic coefficients. The suggested arrangements of rings 28 are attached to the bore 12, step 78. Then, the magnetic field strength is remeasured, step 80, and new harmonic coefficients, as altered by the attachment of the rings 28, are calculated for all three groups, step 82. It should be noted that each time new coefficients are calculated, in steps 60, 70, 82, and 100, a new overall peak-to-peak inhomogeneity is also calculated. Next, the new values of the Zonal group coefficients are evaluated, step 84. If they are not satisfactory, the method returns to step 76. If they are satisfactory, the method proceeds to step 86.

The overall peak-to-peak inhomogeneity is evaluated, along with other characteristics of the field such as the existence of numerous sharp peaks and valleys, to determine whether additional optimization is necessary, step 86. If these characteristics are satisfactory, the method is complete, step 102. If one or more of these characteristics is unsatisfactory, one of two possible corrective actions is begun either by simultaneously analyzing all of the harmonic coefficients, or by viewing graphs of the field strength, step 88. Additional or revised dipole positions and sizes are then calculated, step 90, and the dipoles are put in place, relocated, or removed, or dipole sizes are increased or reduced, as indicated, step 96. After remeasuring the field strength, step 98, new harmonic coefficients and a new overall peak-to-peak inhomogeneity are calculated, step 100. The aforementioned field characteristics are then reevaluated, step 86, and another iteration is performed, or the method is complete.

While the particular method for passively shimming an MRI device as herein shown and disclosed in detail is fully capable of obtaining the objects and providing the advantages hereinbefore stated, it is to be understood that it is merely illustrative of the preferred embodiments of the invention and that no limitations are intended to the details of construction or design herein shown other than as defined in the appended claims.

We claim:

1. A method for passively shimming a hollow cylindrical magnet, having a central bore defined by a cylindrical surface, to reduce inhomogeneity of the magnetic field in a defined Diameter Spherical Volume (DSV) inside said bore, the method comprising the steps of:
   measuring said magnetic field at a plurality of selected points in said DSV;
   generating a polynomial to model any inhomogeneity detected in said magnetic field in accordance with said field measurements, said polynomial having a plurality of harmonic terms, each said harmonic term having a coefficient;
   selecting a target value for each said coefficient, said target values being selected to result in a desired reduction of said inhomogeneity in said magnetic field;
   separating said plurality of harmonic terms into a plurality of groups, each said group expressing variations in said magnetic field only in directions which are uniquely defined for each said group;
   separately analyzing each said group of said harmonic terms, to determine the contribution of each said group of terms to said inhomogeneity; and
   designing a shim array for each said group, each said shim array being designed to minimize said harmonic terms in a given group.

2. A method as claimed in claim 1, further comprising the steps of:
   positioning said shim array designed for a first said group on said surface of said bore, after separately analyzing said first group and before analyzing another said group;
   remeasuring said magnetic field;
   recalculating said coefficient for each said harmonic term;
   comparing each said recalculated coefficient in said first group to its respective target value; and
   repeating said steps of designing said shim array, positioning said shim array, remeasuring said field, and recalculating said coefficients, until said coefficients in said first group reach their respective target values, before designing said shim array for a second said group.

3. A method as claimed in claim 2, wherein:
   said first group of said harmonic terms expresses field inhomogeneity in three dimensions;
   said second group of said harmonic terms expresses field inhomogeneity in only radial and angular dimensions; and
   a third said group of said harmonic terms expresses field inhomogeneity in only an axial dimension.

4. A method as claimed in claim 3, wherein:
   said shim array designed for said first group of terms includes at least one dipole;
   said shim array designed for said second group of terms includes at least one bar; and
   said shim array designed for said third group of terms includes at least one ring.

5. A method as claimed in claim 4, wherein said bar comprises a plurality of dipoles arranged linearly on said surface in the form of a bar, and substantially parallel to the axis of said bore.

6. A method as claimed in claim 4, wherein said ring comprises a plurality of dipoles arranged in a circle on said surface, in a plane perpendicular to the axis of said bore.

7. A method as claimed in claim 1, wherein:
   said DSV has a spherical surface; and
   said selected points for measuring said magnetic field are on said spherical surface of said DSV.

8. A method as claimed in claim 1, wherein said shim arrays are composed of iron.

9. A method as claimed in claim 1, further comprising the steps of:
   positioning said shim arrays designed for a first said group and a second said group on said surface of said bore, after separately analyzing said first and second groups and before analyzing another said group;
   remeasuring said magnetic field;
   recalculating said coefficient for each said harmonic term;
   comparing each said recalculated coefficient in said first and second groups to its respective target value; and
   repeating said steps of designing said shim arrays, positioning said shim arrays, remeasuring said field, and recalculating said coefficients, until said coefficients in said first and second groups reach their respective target values, before designing said shim array for another said group.

10. A method for passively shimming a hollow cylindrical magnet, having a central bore defined by a cylindrical surface, to reduce inhomogeneity of the magnetic field in a defined Diameter Spherical Volume (DSV) inside said bore, the method comprising the steps of:

measuring said magnetic field at a plurality of selected points in said DSV;

generating a harmonic equation to model said magnetic field in accordance with said field measurements, said equation having the form $$B_o \sum_{n=0}^{\infty} \sum_{m=0}^{n} (r/r_o)^n P_n^m(\theta)[A_n^m \cos m\phi + B_n^m \sin m\phi];$$

where $B_z$ is the axial component of the magnetic field at a selected point, $B_O$ is the central field intensity, $r_O$ is the radius of said DSV, and $r$, $\theta$, and $\phi$ are the spherical coordinates of said selected point;

selecting a maximum allowed value for a coefficient of each of a plurality of harmonic terms of said equation, said maximum values being selected to result in a desired reduction of said inhomogeneity in said magnetic field;

separating said plurality of harmonic terms into three groups, each said group expressing variations in said magnetic field only in directions which are uniquely defined for each said group;

separately analyzing a first said group of said harmonic terms, to determine the contribution of said first group to said inhomogeneity, said first group expressing inhomogeneity in three dimensions;

designing a dipole array to minimize said harmonic terms in said first group;

positioning said dipole array on said surface of said bore;

remeasuring said magnetic field;

recalculating said coefficients of said plurality of harmonic terms of all three groups; and evaluating whether said coefficients of said first group of harmonic terms have been reduced to their respective maximum allowed values.

11. A method as claimed in claim 10, further comprising the step of repeating said steps of designing a dipole array, positioning said dipole array, remeasuring said magnetic field, recalculating said coefficients, and evaluating said first group of harmonic terms, until said coefficients of said first group of terms are reduced to their respective maximum allowed values.

12. A method as claimed in claim 10, further comprising the steps of:

separately analyzing a second said group of said harmonic terms, to determine the contribution of said second group to said inhomogeneity, said second group expressing inhomogeneity in only the angular and radial dimensions;

designing a bar array to minimize said harmonic terms in said second group;

positioning said bar array on said surface of said bore;

remeasuring said magnetic field;

recalculating said coefficients of said plurality of harmonic terms; and evaluating whether said coefficients of said second group of harmonic terms have been reduced to their respective maximum allowed values.

13. A method as claimed in claim 12, further comprising the step of repeating said steps of designing a bar array, positioning said bar array, remeasuring said magnetic field, recalculating said coefficients, and evaluating said second group of harmonic terms, until said coefficients of said second group of terms are reduced to their respective maximum allowed values.

14. A method as claimed in claim 12, further comprising the steps of:

separately analyzing said third group of said harmonic terms, to determine the contribution of said third group to said inhomogeneity, said third group expressing inhomogeneity in only the axial dimension;

designing a ring array to minimize said harmonic terms in said third group;

positioning said ring array on said surface of said bore;

remeasuring said magnetic field;

recalculating said coefficients; and evaluating whether said coefficients of said third group of harmonic terms have been reduced to their respective maximum allowed values.

15. A method as claimed in claim 14, further comprising the step of repeating said steps of designing a ring array, positioning said ring array, remeasuring said magnetic field, recalculating said coefficients, and evaluating said third group of harmonic terms, until said coefficients of said third group of terms are reduced to their respective maximum allowed values.

* * * * *